(12) United States Patent
Iwagami

(10) Patent No.: US 8,216,950 B2
(45) Date of Patent: Jul. 10, 2012

(54) CAPACITIVE ELEMENT FABRICATION METHOD

(75) Inventor: Norikazu Iwagami, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 83 days.

(21) Appl. No.: 12/631,217

(22) Filed: Dec. 4, 2009

(65) Prior Publication Data

US 2010/0081241 A1    Apr. 1, 2010

Related U.S. Application Data

(62) Division of application No. 11/389,139, filed on Mar. 27, 2006, now abandoned.

(30) Foreign Application Priority Data

Mar. 28, 2005   (JP) ................................. 2005-093275

(51) Int. Cl.
*H01L 21/02* (2006.01)

(52) U.S. Cl. ........ 438/791; 438/261; 438/197; 438/207; 438/909

(58) Field of Classification Search ................... 438/197, 438/261, 787, 791, 909, 207
See application file for complete search history.

(56) References Cited

U.S. PATENT DOCUMENTS

| | | | | |
|---|---|---|---|---|
| 5,731,238 | A * | 3/1998 | Cavins et al. ................. | 438/261 |
| 6,486,530 | B1 * | 11/2002 | Sasagawa et al. ............. | 257/532 |
| 6,903,377 | B2 * | 6/2005 | Yamazaki et al. ............. | 257/88 |
| 2004/0145059 | A1 | 7/2004 | Koike et al. | |
| 2004/0238820 | A1 | 12/2004 | Sakama et al. | |
| 2005/0118837 | A1 | 6/2005 | Todd et al. | |
| 2007/0082132 | A1 * | 4/2007 | Shinriki et al. ........ | 427/255.394 |

FOREIGN PATENT DOCUMENTS

| | | |
|---|---|---|
| JP | 61-284929 A | 12/1986 |
| JP | 5-47753 A | 2/1993 |
| JP | 9-260372 A | 10/1997 |

* cited by examiner

*Primary Examiner* — Marcos D. Pizarro
*Assistant Examiner* — Bilkis Jahan
(74) *Attorney, Agent, or Firm* — Westerman, Hattori, Daniels & Adrian, LLP

(57) ABSTRACT

A semiconductor device includes an operating layer made of a semiconductor and a silicon nitride film formed on the operating layer with the use of a mixed gas that includes mono-silane gas, hydrogen gas, and nitrogen gas, by a plasma CVD apparatus, under a condition that a flow rate of the hydrogen gas is 0.2 percent to 5 percent to an overall flow rate.

6 Claims, 9 Drawing Sheets

THICKNESS OF SILICON NITRIDE FILM [nm]

CAPACITIVE ELEMENT FABRICATION METHOD

CROSS-REFERENCE TO RELATED APPLICATION

This application is a divisional application of Ser. No. 11/389,139, filed Mar. 27, 2006 which is based upon and claims the benefit of priority from the prior Japanese Patent Application No. 2005-093275, filed Mar. 28, 2005, the entire contents of which are hereby incorporated by reference.

BACKGROUND OF THE INVENTION

1. Field of the Invention

This invention generally relates to a semiconductor device that includes a silicon nitride film having a high breakdown voltage and fabrication method therefor, a capacitive element and fabrication method therefor, and a MIS type semiconductor device and fabrication method therefor.

2. Description of the Related Art

A silicon nitride is often for use in a capacitor insulating film, passivation film, gate insulating film, and mask film in the selective process of a semiconductor device.

Silicon included in such silicon nitride film is supplied with mono-silane gas ($SiH_4$), and nitrogen is supplied with ammonia gas ($NH_3$) or nitrogen gas ($N_2$). Then, the silicon nitride film is grown by vapor growth method with the use of a mixed gas that includes the afore-described gasses at appropriate ratios. In particular, plasma enhanced Chemical Vapor Deposition (plasma CVD) is commonly employed with the use of a plasma CVD apparatus, after the mixed gas is brought into a plasma state.

There is a demand that the silicon nitride film should have a high breakdown voltage used for the capacitor insulating film, passivation film, gate insulating film, and mask film in the selective process in order to ensure the reliability of the semiconductor device, especially which is used as a power device. Additionally, there is another demand that the silicon nitride film should be formed at low temperatures, since the electrode that lacks heat resistance is used in a compound semiconductor device suitable for the power device.

FIG. 1 is a graph showing thickness dependency of a breakdown voltage and capacitance of a capacitor that employs the silicon nitride film that has been grown in a conventional technique as a capacitor insulating film. The breakdown voltage of the capacitor becomes higher, in a rough proportion to the increased thickness of the silicon nitride film. However, the capacitance of the capacitor drastically decreases with the increased thickness of the silicon nitride film. That is to say, there is a trade-off relationship between the breakdown voltage of the capacitor and the dependency of the capacitance on the silicon nitride film.

The silicon nitride film that has been grown in the conventional technique does not sufficiently exhibit the breakdown voltage characteristic that satisfies the above-described demands. In order to obtain the capacitor (metal film-insulating film-metal film) having a desired breakdown voltage, for example, there is no other choice that the silicon nitride film sandwiched by the metal films are configured to have a thickness of twice the insulating film to enhance the breakdown voltage. Such thickened capacitor insulating film leads to a decrease in the capacitance of the capacitor, so the area of the capacitor has to be roughly doubled to ensure a given capacitance. However, if the area of the capacitor is increased, the chip size will also be increased. This is problematic in that it is difficult to realize a highly integrated semiconductor device and the costs thereof are increased.

It is known that hydrogen taken into the silicon nitrogen film prevents the breakdown voltage thereof from increasing.

FIG. 2 is a graph showing the relationship between hydrogen concentration and breakdown voltage that have been measured in the Fourier Transform Infrared technique (FTIR). As the hydrogen concentration taken into the film is increased, the breakdown voltage linearly decreases. Here, the breakdown voltage was measured where the silicon nitride has a thickness of 100 nm and a current density is 100 $mA/mm^2$.

Japanese Patent Application Publication No. 9-260372 (hereinafter, referred to as Document 1) discloses a method of decreasing the hydrogen concentration in the film. In order to decrease the leakage current caused by the defect induced by hydrogen that has been taken into the silicon nitride film deposited by CVD, such deposited silicon nitride film is heated at high temperatures to emit hydrogen existent in the form of N—H or Si—H from the silicon nitride film as a gas. In this manner, the silicon nitride film having a low hydrogen concentration is obtainable.

Japanese Patent Application Publication No. 61-284929 (hereinafter, referred to as Document 2) discloses a method of forming the silicon nitride film with the use of mono-silane gas ($SiH_4$), nitrogen gas ($N_2$), and hydrogen gas ($H_2$). The silicon nitride film is deposited by plasma CVD with approximately at least six percent of the flow rate of the hydrogen gas (hereinafter, referred to as hydrogen gas flow rate) relative to the overall gas flow rate. Japanese Patent Application Publication No. 5-47753 (hereinafter, referred to as Document 3) discloses a method of forming the silicon nitride film with the use of mono-silane gas ($SiH_4$) and nitrogen gas ($N_2$). The silicon nitride film is formed by plasma CVD with approximately five percent of the flow rate of the mono-silane gas (hereinafter, referred to as mono-silane gas flow rate) relative to the overall gas flow rate.

The method disclosed in Document 1, however, is supposed to be applied to a silicon semiconductor. Accordingly, after the silicon nitride film is formed, heat treatment is carried out at high temperatures of 800° C. or more. This makes it impossible to be applied to the compound semiconductor device that needs the processes implemented at relatively low temperatures. Besides, it is actually impossible to remove hydrogen completely as far as the technique that emits hydrogen from the silicon nitride film after the film is once formed is employed.

Accordingly, in order to obtain the silicon nitride film having a high breakdown voltage with the hydrogen concentration reduced to the minimum, there is a demand for a technique of forming the silicon nitride film in such a manner that hydrogen is not taken into the silicon nitride film during the film-forming process.

In addition, according to the methods disclosed in Document 2 and Document 3, as will be described later in detail, the hydrogen concentration in the silicon nitride film that has been formed cannot be decreased at low temperatures to be used in the fabrication of the compound semiconductor device.

SUMMARY OF THE INVENTION

It is a general object of the present invention to realize a silicon nitride film having a high breakdown voltage at a relatively low film-forming temperature and to provide a semiconductor device having a capacitor, passivation film, gate insulating film, and a mask film used in a selective process having a high breakdown voltage and high reliability (high humidity resistance), by using the afore-described silicon nitride film as a capacitor insulating film, passivation film, gate insulating film, and mask film.

A more specific object of the present invention is to provide the afore mentioned semiconductor device and a fabrication method of the same, a capacitive element and a fabrication method of the same, and a MIS type semiconductor device and a fabrication method of the same.

According to one aspect of the present invention, preferably, there is provided a semiconductor device including: an operating layer made of a semiconductor; and a silicon nitride film formed on the operating layer with the use of a mixed gas that includes mono-silane gas, hydrogen gas, and nitrogen gas, by a plasma CVD apparatus, under a condition that a flow rate of the hydrogen gas is 0.2 percent to 5 percent to an overall flow rate. In accordance with the present invention, it is possible to provide a semiconductor device having a high reliability by using the silicon nitride film having a high breakdown voltage as a passivation film.

In the afore-described semiconductor device, a hydrogen content may be at most 1 atomic percent in the silicon nitride film. The operating layer may be made of any of silicon, silicon carbide, an In-based semiconductor, a GaAs-based semiconductor, and a GaN-based semiconductor.

According to another aspect of the present invention, preferably, there is provided a capacitive element including: a first metal layer; a silicon nitride film formed on the first metal layer with the use of a mixed gas that includes mono-silane gas, hydrogen gas, and nitrogen gas, by a plasma CVD apparatus, under a condition that a flow rate of the hydrogen gas is 0.2 percent to 5 percent to an overall flow rate; and a second metal layer formed on the silicon nitride film. In accordance with the present invention, it is possible to provide a capacitive element having a high reliability by using the silicon nitride film having a high breakdown voltage as a capacitor insulating film.

In the afore-described capacitive element, a hydrogen content may be at most 1 atomic percent in the silicon nitride film. The silicon nitride film may have a thickness of 50 nm to 300 nm.

According to still another aspect of the present invention, preferably, there is provided a MIS type semiconductor device including: an operating layer made of a semiconductor; a gate insulating film made of a silicon nitride film formed on the operating layer with the use of a mixed gas that includes mono-silane gas, hydrogen gas, and nitrogen gas, under a condition that a flow rate of the hydrogen gas is 0.2 percent to 5 percent to an overall flow rate; a gate electrode formed on the gate insulating film; and a source electrode and a drain electrode formed on the operating layer to interpose the gate electrode therebetween. In accordance with the present invention, it is possible to provide a MIS type semiconductor device having a high reliability in which the operating voltage is reduced, by using the silicon nitride film having a high breakdown voltage as a gate insulating film.

In the afore-described MIS type semiconductor device, a hydrogen content may be at most 1 atomic percent in the silicon nitride film. The operating layer may be made of either silicon or silicon carbide.

According to yet another aspect of the present invention, preferably, there is provided a fabrication method of a semiconductor device including: forming an operating layer made of a semiconductor; and forming a insulating film made of a silicon nitride film on the operating layer with a mixed gas that includes mono-silane gas, hydrogen gas, and nitrogen gas, in a plasma CVD apparatus, under a condition that a flow rate of the hydrogen gas is 0.2 percent to 5 percent to an overall flow rate. In accordance with the present invention, it is possible to provide a fabrication method of a semiconductor device having a high reliability by using the silicon nitride film having a high breakdown voltage as a passivation film.

In the afore-described fabrication method, the step of forming the insulating film may be a step of processing used for any of a passivation film, a gate insulating film, an a capacitive element.

According to further another aspect of the present invention, preferably, there is provided a fabrication method of a semiconductor device including: forming a silicon nitride film on a layer to be selectively processed with the use of a mixed gas that includes mono-silane gas, hydrogen gas, and nitrogen gas, in a plasma CVD apparatus, under a condition that a flow rate of the hydrogen gas is 0.2 percent to 5 percent to an overall flow rate; forming a given mask pattern on the silicon nitride film; and selectively processing the layer with the given mask pattern. In accordance with the present invention, it is possible to provide a fabrication method of a semiconductor device having a high reliability in which the deformation or peel off of the mask layer is suppressed, by using a precisely formed silicon nitride film having a high breakdown voltage as a mask film.

In the afore0described fabrication method, the step of forming the silicon nitride film may be a step of forming the silicon nitride film under a condition that a growth temperature ranges 200° C. to 350° C. The step of forming the silicon nitride film may be a step of forming the silicon nitride film under a condition that a flow rate of the hydrogen gas is 0.4 percent to 4.5 percent to an overall flow rate. The plasma CVD apparatus may be any of a parallel plate type high frequency plasma apparatus, an electron cyclotron resonance plasma apparatus, and an inductive coupled type high-density plasma apparatus.

BRIEF DESCRIPTION OF THE DRAWINGS

Preferred embodiments of the present invention will be described in detail with reference to the following drawings, wherein.

DESCRIPTION OF THE PREFERRED EMBODIMENTS

Figure 1:
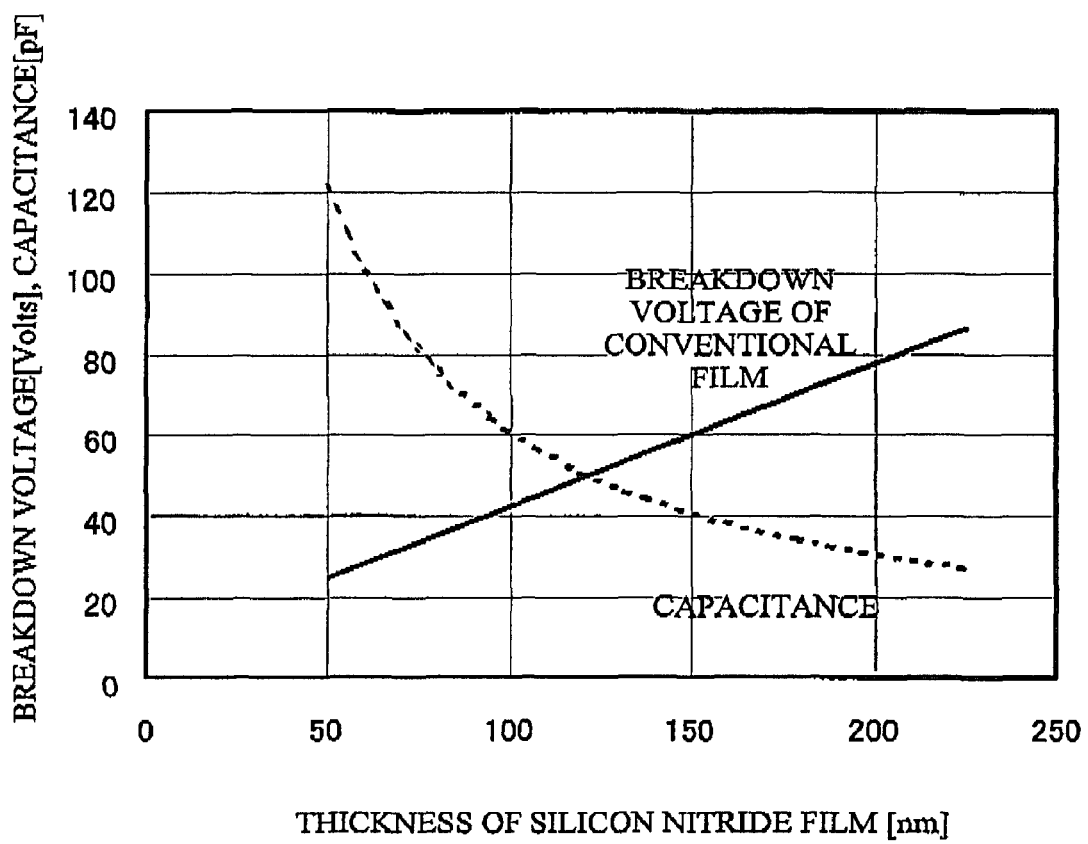
FIG. 1 is a graph showing thickness dependency of a breakdown voltage and capacitance of a capacitor that employs a silicon nitride film that has been grown in a conventional technique as a capacitor insulating film.
Figure 2:
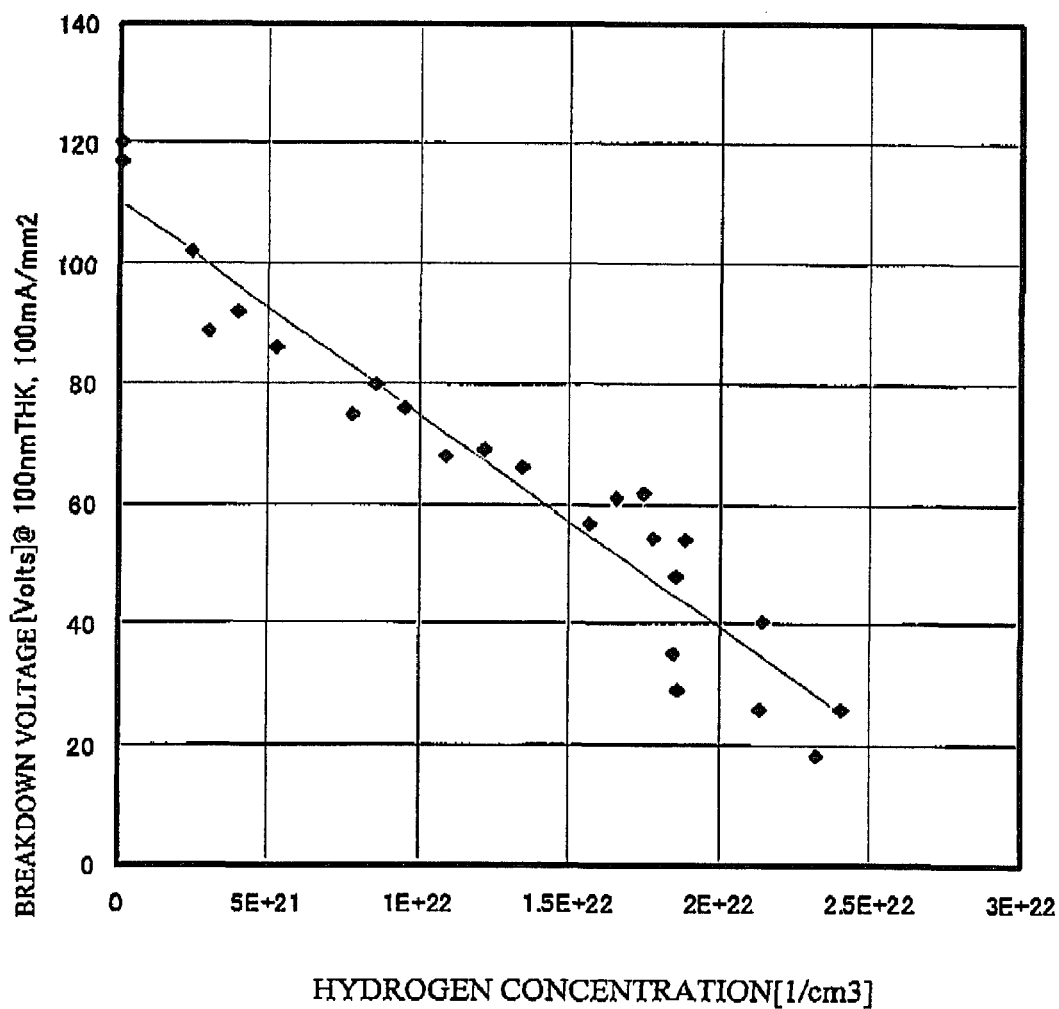
FIG. 2 is a graph showing the relationship between hydrogen concentration and breakdown voltage that have been measured in the Fourier Transform Infrared technique (FTIR)

A description will now be given, with reference to the accompanying drawings, of embodiments of the present invention.

In accordance with the present invention, a source gas used for growing the silicon nitride film by plasma CVD is a mixed gas of three gasses that include mono-silane gas ($SiH_4$), nitrogen gas ($N_2$), and hydrogen gas ($H_2$). The mono-silane gas ($SiH_4$) serves as a silicon supply source of the silicon nitride film. Nitrogen gas ($N_2$) serves as a nitrogen supply source. Hydrogen gas ($H_2$) serves as an added gas. Accordingly, ammonia gas ($NH_3$), which is often used in the conventional technique as a nitrogen supply source, is not included in the source gas. Instead, a small amount of hydrogen gas is added.

How to compose the above-described source gas is based on the studies of the inventor of the present invention as below. The inventor of the present invention particularly focused on the standard free energy of formation (Gipps free energy) of various types of gas molecules included in the source gas. That is to say, $SiH_4 > H_2 > NH_3$ is the order of the standard free energy of formation among the $SiH_4$ that includes hydrogen molecules, $H_2$, and $NH_3$. $NH_3$ is the most stable gas molecules. Such stable $NH_3$ molecules are bonded again soon, even if $NH_3$ molecules are resolved in plasma. $NH_3$ molecules resolved in plasma have "the effect of extracting hydrogen" from $SiH_4$ molecules. However, $NH_3$ molecules in a bonding state do not have "the effect of extracting hydrogen". In addition, $NH_3$ molecules in a bonding state are taken into the silicon nitride film. Consequently, the hydrogen concentration is increased in the silicon nitride film.

$H_2$, on the other hand, is not as stable as $NH_3$, and is not bonded again immediately after resolved in plasma. Therefore, "the effect of extracting hydrogen" from $SiH_4$ molecules is intense, and the hydrogen concentration taken into the silicon nitride is reduced. "The effect of extracting hydrogen" is now described in detail with an example of $H_2$ molecules. $SiH_4$ molecules have a high affinity with electricity, and become negative ions in plasma to produce a state where electron concentration is small in plasma. If a small amount of hydrogen gas is added, $H_2$ molecules will be resolved and electrons will be released.

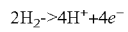

With this electron, a silicon element included in $SiH_4$ molecules increases the valence of negative ion.

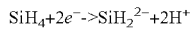

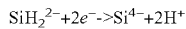

That is to say, hydrogen that composes $SiH_4$ is extracted.

In accordance with the above-described theory, the stable $NH_3$ gas molecules are removed from the source gas and a small amount of hydrogen gas is added. This should enhance "the effect of extracting hydrogen" from $SiH_4$ molecules, and hydrogen to be taken into the silicon nitride film should be reduced. The inventor of the present invention considered that nitrogen gas ($N_2$) should be used instead of a $NH_3$ gas as a nitrogen supply source. This conception is quite unique and original. A small amount of hydrogen gas is added to the silicon nitride film in order to reduce the hydrogen concentration therein.

Figure 3:
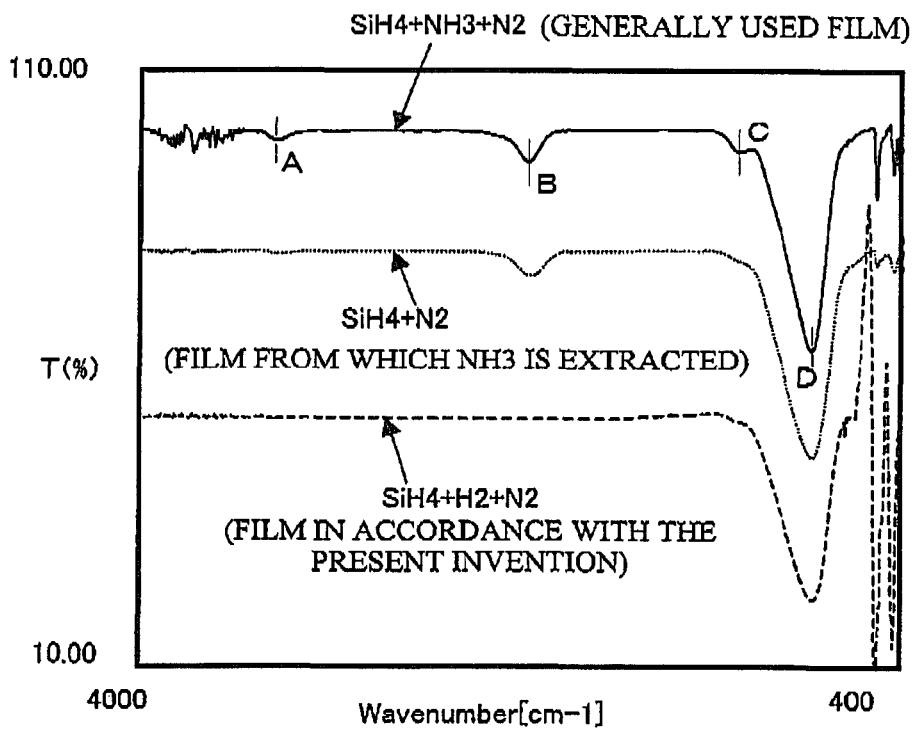
FIG. 3 is a graph showing a spectrum example, measured in FTIR technique, of hydrogen concentration in the silicon nitride film that has been formed according to the above-described theory in accordance with the present invention.

FIG. 3 is a graph showing a spectrum example, measured in FTIR technique, of hydrogen concentration in the silicon nitride film that has been formed in accordance with the above-described theory of the present invention. For comparison, FIG. 3 also shows the spectrum of the silicon nitride film formed with a mixed gas of $SiH_4$, $NH_3$, and $N_2$ as a source gas, and also shows that of the silicon nitride film formed with a mixed gas of $SiH_4$ and $N_2$ as a source gas.

In the spectrum that ranges from 400 $cm^{-1}$ to 4000 $cm^{-1}$, there are three peaks induced by hydrogen: A (N—H stretching mode: to 3350 $cm^{-1}$), B (Si—H stretching mode: to 2160 $cm^{-1}$), and C (N—H bending mode: to 1170 $cm^{-1}$). The intense peak around 820 $cm^{-1}$ is Si—N stretching mode, as indicated by D.

The silicon nitride film formed with a mixed gas of $SiH_4$, $NH_3$, and $N_2$ serving as the source gas corresponds to the silicon nitride film formed on a generally used condition. The absorption peak caused by hydrogen can be obviously seen. In contrast, the silicon nitride film formed with a mixed gas of $SiH_4$ and $N_2$ has weaker peaks caused by hydrogen. This exhibits the effect of removing $NH_3$ from the source gas.

In addition, no absorption peak caused by hydrogen can be seen in the silicon nitride film formed with the source gas in which $H_2$ gas is added to a mixed gas of $SiH_4$ and $N_2$ in accordance with the present invention. This exhibits that the silicon nitride film in accordance with the present invention has an extremely low hydrogen concentration.

Approximately one atomic percent is the lower limit in the detection of the hydrogen content included in the silicon nitride film, in FTIR technique employed in this analysis. Accordingly, the hydrogen content is less than one atomic percent in the silicon nitride film formed by the technique in accordance with the present invention.

Figure 4:
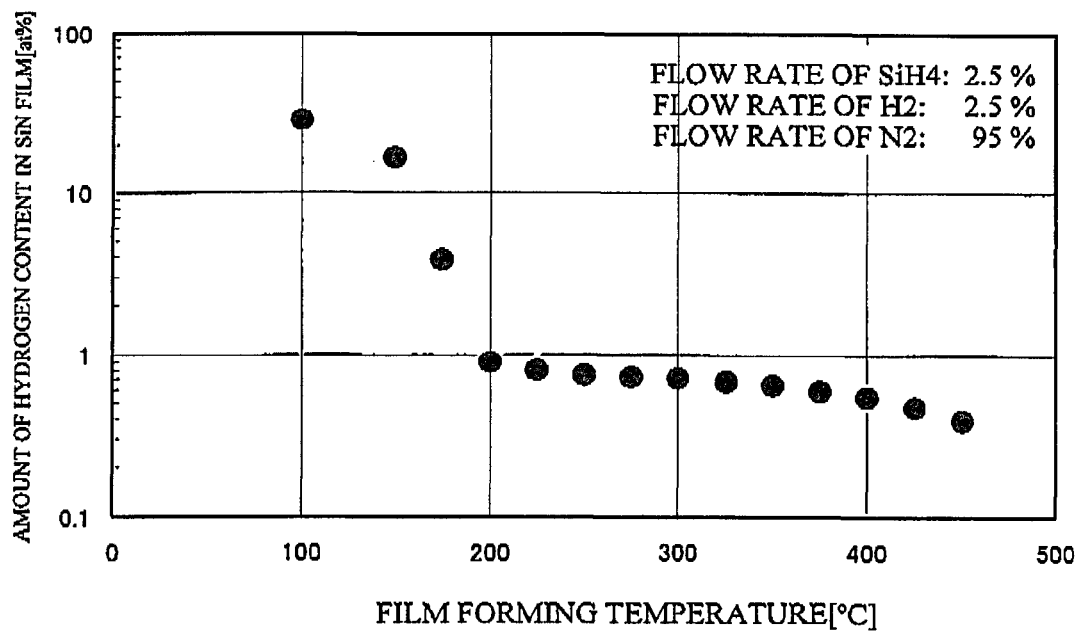
FIG. 4 shows dependency of the hydrogen content in the silicon nitride film on film-forming temperature.

FIG. 4 shows dependency of the hydrogen content in the silicon nitride film on film-forming temperature. When the temperature is lower than 200° C., the hydrogen content drastically increases in the film. This is because more than a certain temperature is necessary for resolving the source gas.

In the fabrication of the compound semiconductor device, the source electrode and drain electrode are formed in the alloying method at 400° C. to 500° C. The transistor characteristics degrade at the temperature that exceeds 350° C. Preferably, the silicon nitride film is formed at 350° C. or less. More preferably, 300° C. or less. Accordingly, it is preferable that the temperature should be set at a range from 200° C. to 350° C. More preferably, from 200° C. to 300° C.

Figure 5:
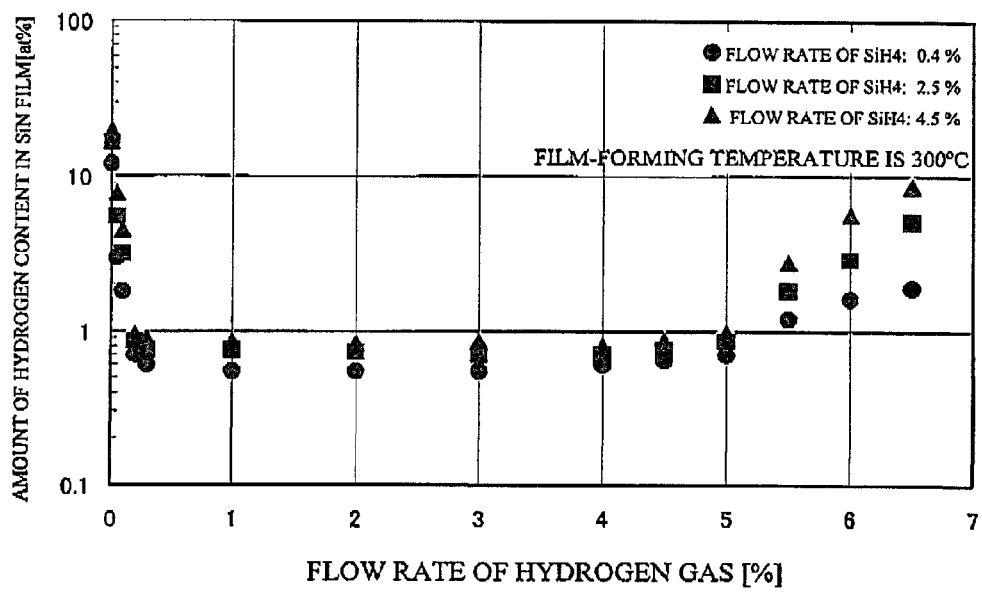
FIG. 5 shows flow rate dependency of the hydrogen content in the silicon nitride film.

FIG. 5 shows dependency of the hydrogen content in the silicon nitride film on the hydrogen gas flow rate, with respect to 0.4%, 2.5%, and 4.5% of silane gas flow rates. The hydrogen content in the silicon nitride film is approximately less than one atomic percent, when the hydrogen gas flow rate ranges from 0.2% to 5% and the silane gas flow rate ranges from 0.4% to 4.5%. The hydrogen content is increased in the silicon nitride film when the hydrogen flow rate is less than 0.2%. This is because the above-described "effect of extracting hydrogen" is weakened, if the amount of hydrogen gas is small in the film. Therefore, in a case where no hydrogen is used as described in Document 3, it is considered that "the effect of extracting hydrogen" is not available. On the other hand, the hydrogen content in the film is increased when the hydrogen gas flow rate is 5% or more. This is because the hydrogen gas is taken into the film more than "the effect of extracting hydrogen". If the hydrogen flow rate is large, the hydrogen content will be increased as described in Document 2.

As described heretofore, it is preferable that the silicon nitride film should be formed with the use of a mixed gas of mono-silane gas, hydrogen gas, and nitrogen gas, on the condition of the hydrogen flow rate of 0.2% to 5% relative to the overall flow rate, to realize the silicon nitride film having a high breakdown voltage at a relatively low film-forming temperature. This makes it possible to form the silicon nitride film having the hydrogen content of one atomic percent or less, at the film-forming temperature of 200° C. to 350° C.

Referring to FIG. 5, it is obvious that the silicon nitride films that have been formed under the film-forming conditions disclosed in Document 2 and Document 3 have more than one atomic percent of hydrogen content. The conventional techniques disclosed in Document 2 and Document 3 do not satisfy any of the objects of the present invention.

First Embodiment

A description will be given of a first embodiment of the present invention. This is a case where a capacitor (capacitive element) having a structure of MIM (metal film-insulating film-metal film) is formed.

Figure 6:
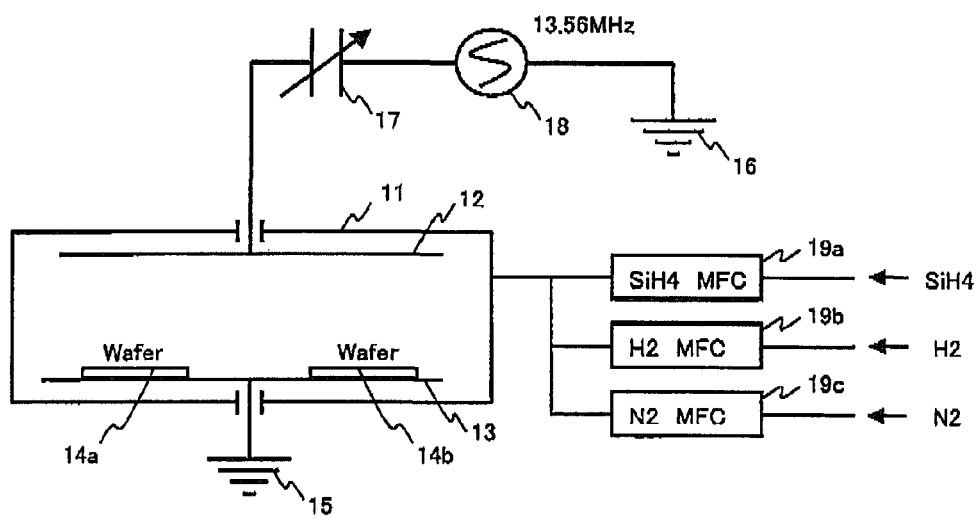
FIG. 6 is a block diagram showing a configuration of a plasma CVD film-forming apparatus used in the first embodiment of the present invention.

FIG. 6 is a block diagram showing a configuration of a plasma CVD film-forming apparatus (parallel plate type high frequency plasma apparatus). A reference numeral 11 represents a film-forming chamber. A reference numeral 12 represents an upper electrode. A reference numeral 13 represents a susceptor that also serves as a lower electrode. Reference numerals 14a and 14b represent deposition substrates. Reference numerals 15 and 16 represent earth. A reference numeral 17 represents a matching capacitor. A reference numeral 18 represents a high-frequency power source of 13.56 MHz. Reference numerals 19a, 19b, and 19c respectively represent mass flow controllers for $SiH_4$, $H_2$, and $N_2$.

The upper electrode 12 and the susceptor 13 that also serves as the lower electrode are plane plates and provided in parallel. The source gas is resolved by a high frequency applied between the electrodes, and the silicon nitride films are deposited on the substrates 14a and 14b.

The source gas used for film forming is a mixed gas of $SiH_4$ and $N_2$ to which $H_2$ gas is added. The mixed ratio thereof is $SiH_4:H_2:N_2=2:1:500$, with respect to, for example, the gas flow rate. An example is 40 sccm:20 sccm:1000 sccm. The pressure is 0.5 to 1.5 Torr in the film-forming chamber 11, and the power density applied between the electrodes 12 and 13 is 0.05 W/cm² to 0.25 W/cm². The afore-described film-forming conditions may be changed as necessary, according to the film-forming temperature, film thickness, and film-forming velocity. That is to say, the silicon nitride film is formed with the use of a mixed gas of mono-silane gas, hydrogen gas, and nitrogen gas, under the conditions that the flow rate of hydrogen gas relative to the overall flow rate is 0.2% to 5%, and the flow rate of mono-silane gas relative to the overall flow rate is 0.4% to 4.5%.

The film-forming temperature (substrate temperature) is controlled by the temperature of the susceptor 13 that holds the substrates 14a and 14b of the semiconductor. According to the film properties of the silicon nitride film to be formed, the temperature is set in a range from 200° C. to 350° C. In accordance with the present embodiment, 300° C. is employed. That is to say, the silicon nitride film is deposited on the condition of the film-forming temperature of 200° C. to 350° C.

In accordance with the first embodiment of the present invention, the parallel plate type high frequency plasma apparatus is employed for depositing the silicon nitride film as a plasma CVD apparatus. However, an electron cyclotron resonance plasma apparatus or an inductive coupled type high-density plasma apparatus may be used. In a case where the electron cyclotron resonance plasma apparatus or the inductive coupled type high-density plasma apparatus is employed for depositing the silicon nitride film, the film may be formed under the conditions that include the flow rate of mono-silane gas is 5 sccm, the flow rate of hydrogen gas is 5 sccm, the flow rate of nitrogen gas is 100 sccm, the pressure is 7.5 m Torr or less, and a high frequency power ranges from 100 W to 600 W.

A film forming is now described. The substrates 14a and 14b are first set in the chamber 11 and the chamber 11 is exhausted to a given degree of vacuum. Then, the film-forming temperature is set by setting the susceptor 13 at a given temperature. In this state, the flow rates of the mass flow controllers 19a, 19b, and 19c are respectively adjusted in each gas line, and the output from the high-frequency power source 18 is set, according to the power density to be applied. The silicon nitride film is grown at a given film-forming velocity, while the source gas is being supplied to obtain a desired film thickness, for example, 50 nm to 300 nm.

Figure 7A:
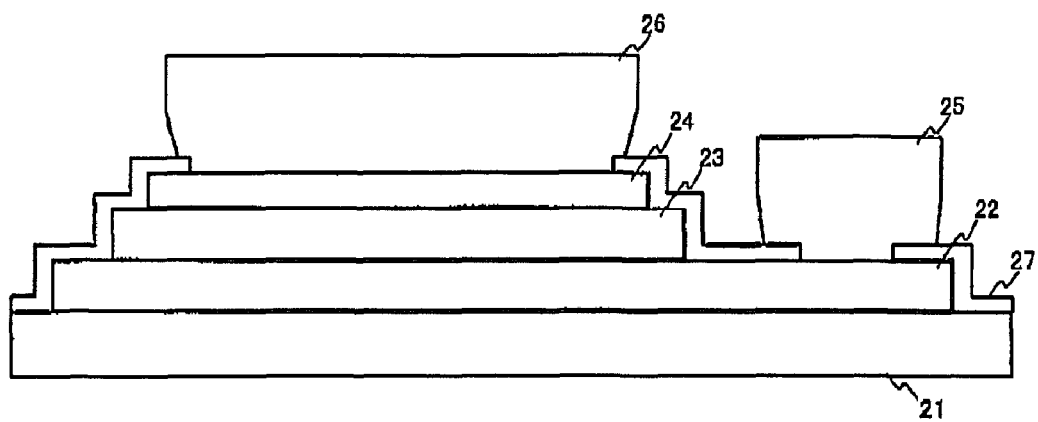
FIG. 7A is a schematic cross-sectional view of the capacitor (capacitive element) in accordance with the first embodiment of the present invention.
Figure 7B:
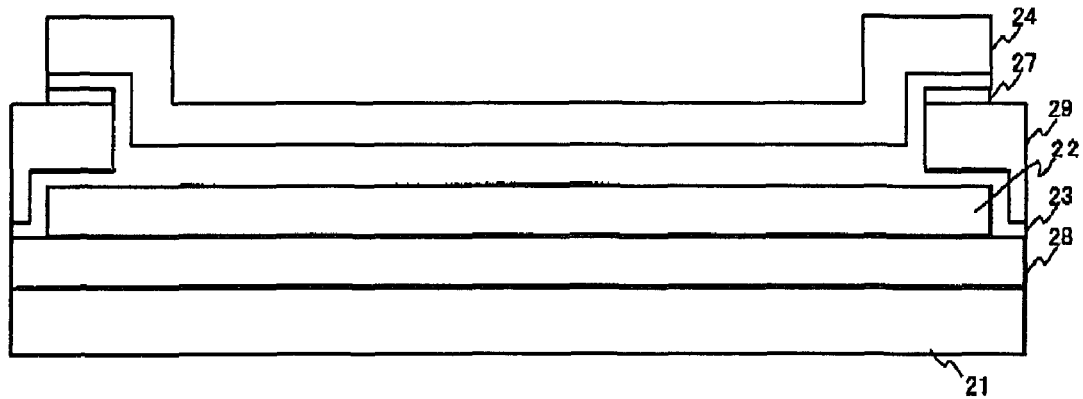
FIG. 7B shows a variation example in accordance with the first embodiment, in which the capacitor insulating film partially serves as a passivation film.

FIG. 7A is a schematic cross-sectional view of the capacitor (capacitive element) in accordance with the first embodiment of the present invention. FIG. 7A is an example of the silicon nitride film used only for the capacitor insulating film. FIG. 7B shows a variation example in accordance with the first embodiment, in which the capacitor insulating film partially serves as a passivation film.

Referring to FIG. 7A, a capacitor is formed by successively depositing a lower electrode (first metal layer) 22, a silicon nitride film 23 that serves as a capacitor insulating film, and an upper electrode (second metal layer) 24, on a main surface of a GaAs substrate 21. An upper wiring 25 in contact with the lower electrode 22 and an upper wiring 26 in contact with the upper electrode 24 are provided via an opening portion of a protection film 27.

The capacitor (capacitive element) in accordance with the first embodiment of the present invention includes the lower electrode (first metal layer) 22, the silicon nitride film 23 formed on the lower electrode 22, and the upper electrode 24 formed on the silicon nitride film 23. Also, this capacitor (capacitive element) can be fabricated by forming the silicon nitride film 23 on the lower electrode (first metal layer) 22 and forming the upper electrode (second metal layer) 24 on the silicon nitride film 23.

Referring to FIG. 7B, an interlayer insulating film 28 is provided on the main surface of the GaAs substrate 21. The capacitor is formed by successively depositing the lower electrode 22, the silicon nitride film 23 that serves as a capacitor insulating film, and the upper electrode 24, on the interlayer insulating film 28. Also, the silicon nitride film 23 serves as a passivation film of a transistor and the interlayer insulating film 28. The transistor is not shown, yet is formed below the interlayer insulating film 28.

Figure 8:
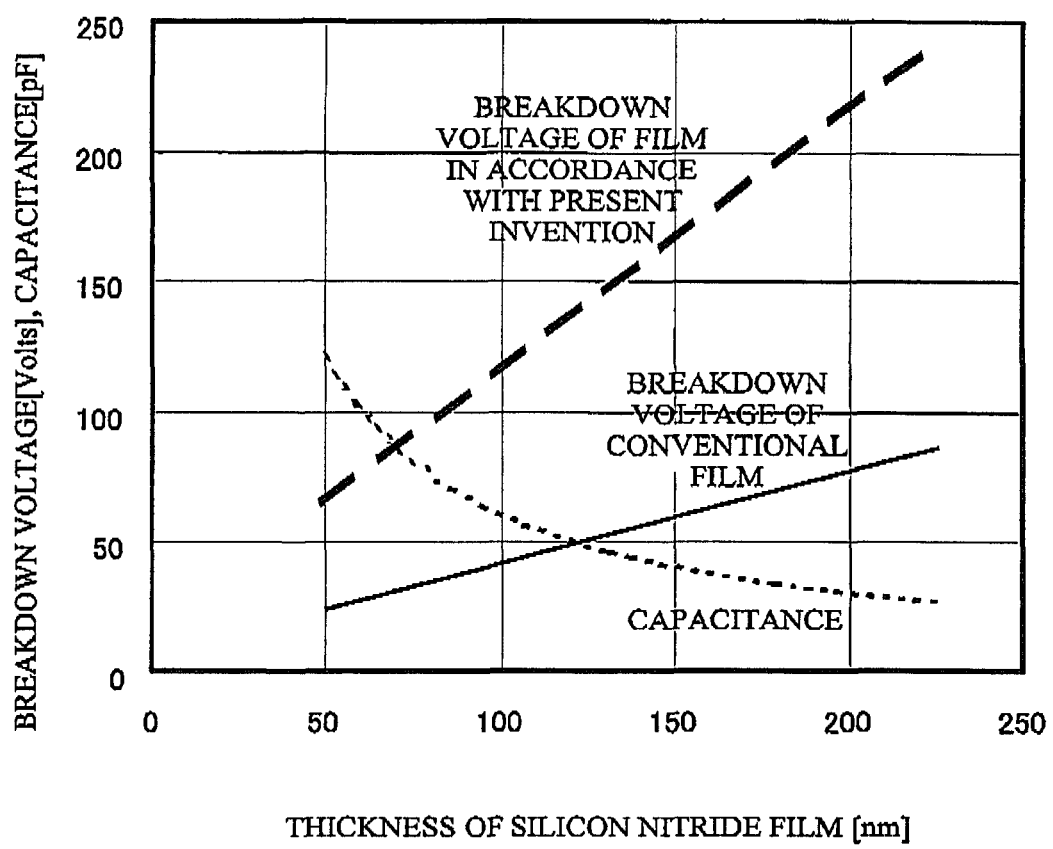
FIG. 8 is a graph showing characteristics of the breakdown voltage of the capacitor in accordance with the first embodiment of the present invention.

FIG. 8 is a graph showing characteristics of the breakdown voltage of the capacitor in accordance with the first embodiment of the present invention. The capacitor has an area of 0.1 mm². The capacitor in accordance with the first embodiment of the present invention has the breakdown voltage almost twice as high as the capacitor having the conventional silicon nitride film. Accordingly, it is possible to retain the breakdown voltage as high as that of the conventional silicon nitride film, even if the thickness of the silicon nitride film is reduced to less than a half of the thickness of the capacitor having the silicon nitride film that is formed in the conventional technique. As a result, the area of the capacitor can be reduced to less than a half, and the chip area can be also reduced.

Figure 9A:
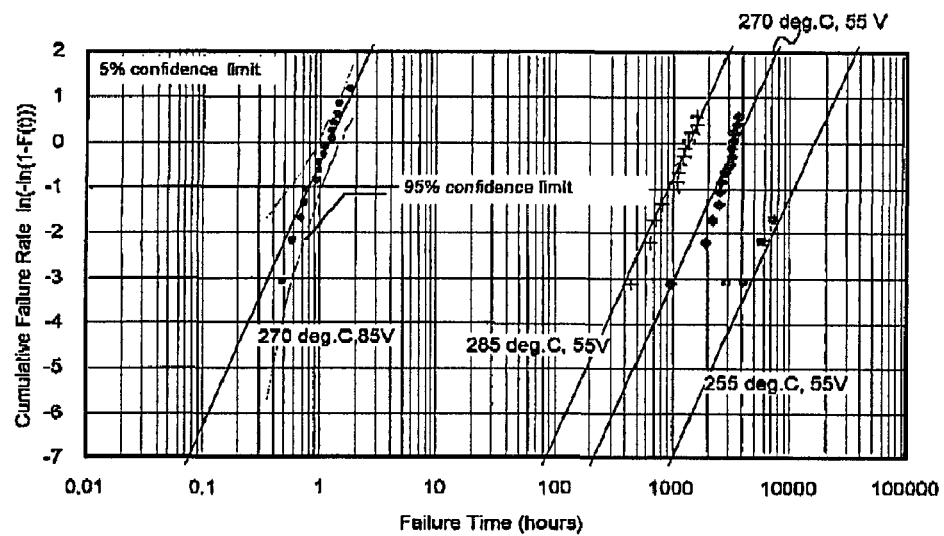
FIG. 9A and FIG. 9B show life test results, by Weibull method, of the capacitor carried out at various test temperatures and various applied voltages.
Figure 9B:
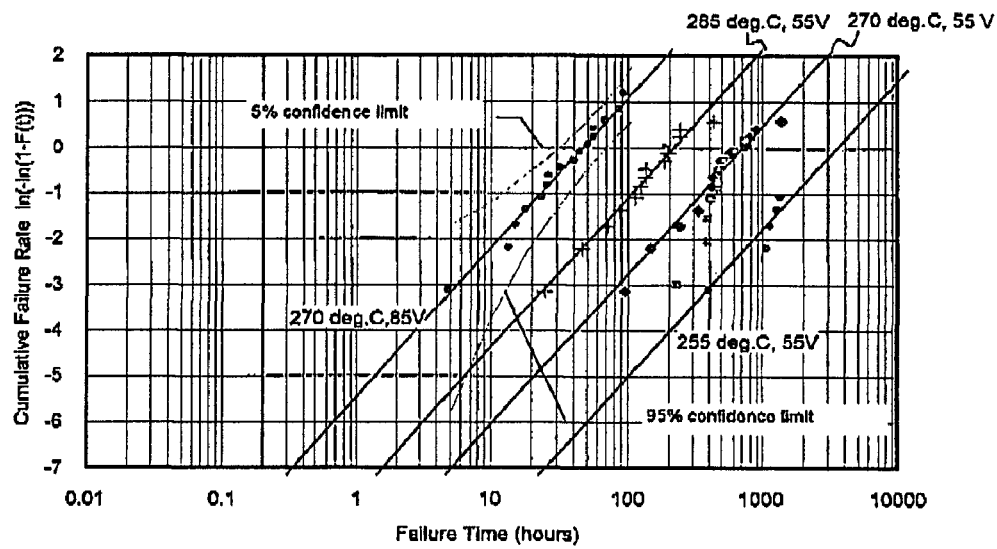

FIG. 9A and FIG. 9B show life test results, by Weibull method, of the capacitor carried out at various test temperatures and various applied voltages. FIG. 9A shows the test results of the capacitor in accordance with the first embodiment of the present invention. FIG. 9B shows the test results of the capacitor having the silicon nitride film formed in the conventional technique. Activation energy and electric field acceleration factor are calculated with the characteristic lives at the various test temperatures and various applied voltages to estimate the lives of the capacitors. The results exhibit that the capacitor in accordance with the first embodiment of the present invention is capable of obtaining the life more than twice that of the capacitor having the silicon nitride film formed in the conventional technique.

From the text results shown in FIG. 9A and FIG. 9B, for example, a description is given below on the reliability of the capacitors fabricated in the conventional technique and in accordance with the first embodiment of the present invention, when the Time Dependent Dielectric Breakdown (TDDB) is carried out. Table 1 shows operating voltages that estimate a failure rate of 0.1% after 10 years operation (referred to as 0.1% of failure rate @ durable operating voltage after 10 years operation) in the cases where 125° C. is an operating temperature of the capacitor having the silicon nitride film formed in the conventional technique (referred to as conventional example), 125° C. is an operating temperature of the capacitor formed in accordance with the first embodiment of the present invention (referred to as first embodiment @ 125° C.), and 150° C. is an operating temperature of the capacitor formed in accordance with the first embodiment of the present invention (referred to as first embodiment @ 150° C.). Film thickness denotes the film thickness of the silicon nitride film in each capacitor. For example, with respect to the silicon nitride film having thickness of 200 nm formed in the conventional example, when 125° C. is the operating temperature, approximately 10 V is the operating voltage in which the failure rate of 0.1% can be estimated after ten years operation. In contrast, with respect to the silicon nitride film having thickness of 200 nm of the first embodiment @ 150° C., approximately 50 V is the operating voltage in which the failure rate of 0.1% can be estimated after ten years operation. In this manner, even if the capacitor in accordance with the first embodiment of the present invention has the operating temperature higher than that of the conventional example, the failure rate of 0.1% can be estimated after ten years operation, at a higher operating voltage. In other words, a highly reliable capacitor (capacitive element) can be thus obtained.

TABLE 1

| | 0.1% of failure rate @ durable operating voltage after 10 years operation (Volts) | | | |
|---|---|---|---|---|
| Film Thickness | 50 nm | 100 nm | 150 nm | 200 nm |
| Conventional Example | 0.91 | 3.7 | 6.6 | 9.5 |
| First Embodiment @ 125° C. | 12.5 | 32.9 | 53.3 | 73.6 |
| First Embodiment @ 150° C. | 7.2 | 22.2 | 37.3 | 52.4 |

As described heretofore, it is possible to obtain the capacitor (capacitive element) having a high breakdown voltage and high reliability in accordance with the first embodiment of the present invention. If the silicon nitride film 23 that also serves as a capacitor insulating film has a film thickness of less than 50 nm in the capacitor (capacitive element) in accordance with the first embodiment of the present invention, a pinhole will be generated in the capacitor insulating film. This short-circuits the lower electrode 22 and the upper electrode 24 of the capacitor. When the silicon nitride film 23 is etched, etching is implemented after a photoresist is provided on the silicon nitride film 23. If the silicon nitride film 23 has a film thickness of more than 300 nm, the temperature of a chamber of an etch apparatus will be increased during the etch process. As a result, the heat hardens the photoresist, which is difficult to be peeled off during the subsequent photoresist peel off process. Accordingly, it is preferable that the silicon nitride film 23 should have a thickness of 50 nm to 300 nm.

Second Embodiment

A second embodiment of the present invention will be described, with an example of a semiconductor device that includes the silicon nitride film that is formed by the film-forming apparatus and method in accordance with the first embodiment of the present invention, the silicon nitride film serving as a passivation film.

Figure 10A:
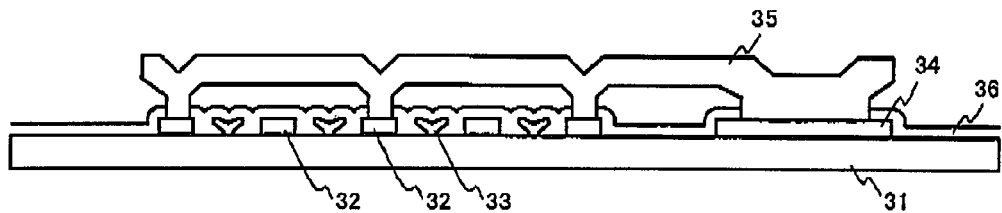
FIG. 10A and FIG. 10B are cross-sectional views partially showing the semiconductor device having the silicon nitride film used as the passivation film.
Figure 10B:
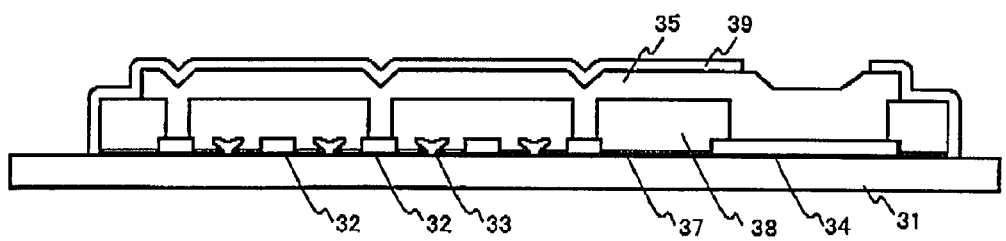

FIG. 10A and FIG. 10B are cross-sectional views partially showing the semiconductor device having the silicon nitride film that serves as the passivation film. FIG. 10A shows the silicon nitride film that serves as an FET passivation film in accordance with the second embodiment of the present invention. FIG. 10B is a variation example in accordance with the second embodiment of the present invention, and shows a final passivation film having an interlayer insulating film. In FIG. 10A and FIG. 10B, a reference numeral 31 represents an operating layer made of a semiconductor. A reference numeral 32 represents a source electrode or drain electrode. A reference numeral 33 represents a gate electrode. A reference numeral 34 represents a pad. A reference numeral 35 represents a wiring. A reference numeral 36 represents the silicon nitride film in accordance with the present invention that serves as an FET passivation film. A reference numeral 37 represents the silicon nitride film in accordance with the present invention that serves as a semiconductor layer passivation film. A reference numeral 38 represents an interlayer insulating film. A reference numeral 39 represents the silicon nitride film in accordance with the present invention that serves as a final passivation film. In accordance with the second embodiment of the present invention, the operating layer 31 is a GaAs-based semiconductor, and the semiconductor device is a MESFET.

That is to say, the semiconductor device in accordance with the second embodiment of the present invention includes the operating layer 31 of a semiconductor and the silicon nitride films 36 and 37 formed on the operating layer 31 by the film-forming apparatus and method in accordance with the first embodiment of the present invention. The semiconductor device in accordance with the second embodiment of the present invention can be fabricated as follows. The operating layer 31 of a semiconductor layer is formed. Then, the silicon nitride films 36 and 37 are formed on the operating layer 31 by the film-forming apparatus and method in accordance with the first embodiment of the present invention.

Figure 11A:
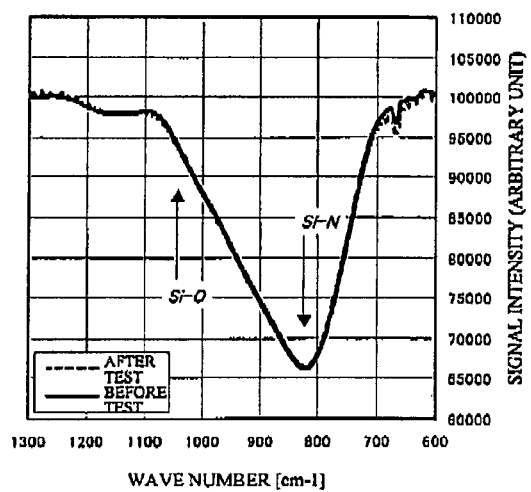
FIG. 11A and FIG. 11B show FTIR results of the silicon nitride film used in the second embodiment of the present invention before and after a high-temperature and humidity test.
Figure 11B:
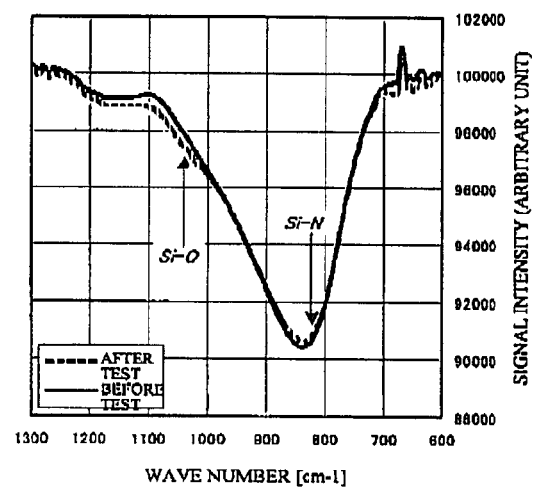

FIG. 11A and FIG. 11B show results, measured in FTIR, of the silicon nitride film in accordance with the second embodiment of the present invention, before and after a high-temperature and high-humidity test (temperature: 85° C., humidity: 85%, and pressure: 0.2 MPa). FIG. 11A shows the results of the silicon nitride film in the second embodiment of the present invention. FIG. 11B shows the results of the conventional silicon nitride film. With respect to the conventional silicon nitride film, the absorption peak is increased due to Si—O bond after the high-temperature and humidity test. This exhibits that the silicon nitride film is partially oxidized and is not suitable for the passivation film. However, with respect to the silicon nitride film in accordance with the second embodiment of the present invention, the absorption peak due to Si—O bond does not change after the high-temperature and humidity test. This exhibits that the silicon nitride film in accordance with the second embodiment of the present invention is precisely formed and excellent in humidity resistance, in addition to a high breakdown voltage. In accordance with the second embodiment of the present invention, it is therefore possible to provide the semiconductor device having a (highly reliable) passivation film that is excellent in humidity resistance. As described above, the semiconductor device in accordance with the second embodiment of the present invention is capable of obtaining a sufficient humidity resistance by carrying out a simple resin potting.

The operating layer in accordance with the second embodiment of the present invention may be made, for example, of silicon, silicon carbide, In-based semiconductor, GaAs-based semiconductor, or GaN-based semiconductor. The second embodiment may be applicable to the GaN-based semiconductor device. The GaN-based semiconductor device may employ a substrate made of any one of sapphire, silicon carbide, and GaN. In addition, the second embodiment may be applicable to an optical semiconductor element, in addition to FETs such as MESFET, HEMT, and the like that employs the GaAs-based semiconductor. Also in the aforementioned cases, it is possible to provide the semiconductor device having a (highly reliable) passivation film that is excellent in humidity resistance. Here, an example of the In-based semiconductor is a semiconductor made of InAlAs or InGaAs. An example of the GaAs-based semiconductor is a semiconductor made of GaAs, AlGaAs, or InGaAs. An example of the GaN-based semiconductor is a semiconductor made of GaN, AlGaN, or InGaN.

Third Embodiment

A third embodiment of the present invention will be described, with an example of a MIS (Metal-Insulator-Semiconductor) type semiconductor device that includes the silicon nitride film formed by the film-forming apparatus and method in accordance with the first embodiment of the present invention.

Figure 12:
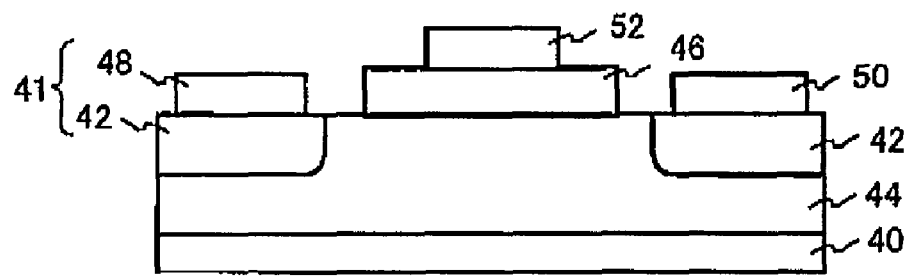
FIG. 12 is a cross-sectional view of a MIS type semiconductor device in accordance with the third embodiment of the present invention.

FIG. 12 is a cross-sectional view of a MIS type semiconductor device in accordance with the third embodiment of the present invention. An operating layer 41 made of a semiconductor (silicon) is provided on a silicon substrate 40. An operating layer 41 includes an n– layer 44 and n+ layer 42. The n– layer 44 has a relatively low carrier concentration. The n+ layer 42 has a relatively high carrier concentration. A gate insulating film 46 is provided on the n– layer 44 by the film-forming apparatus and conditions in accordance with the first embodiment. A gate electrode 52 is formed on the gate insulating film 46. A source electrode 48 and a drain electrode 50 are provided to interpose the gate electrode 52 therebetween.

The silicon nitride film is precisely formed by the film-forming apparatus and method in accordance with the first embodiment. It is therefore effective to be to be used as the gate insulating film of the MIS type semiconductor device. This enables to realize the precisely formed gate insulating film 46 in the MIS type semiconductor device in which silicon or silicon carbide is employed for the operating layer 41. The generation of the pinhole is suppressed in the gate insulating film 46, and the reduction in thickness of the gate insulating film is realized. Such reduced thickness of the gate insulating film 46 contributes to reducing the operating voltage of the MIS type semiconductor device.

Fourth Embodiment

A fourth embodiment of the present invention will be described, with an example of the silicon nitride film that serves as a mask film used in a fabrication method of the semiconductor device. The afore-described silicon nitride film is formed by the film-forming apparatus and method in accordance with the first embodiment of the present invention.

Figure 13A:
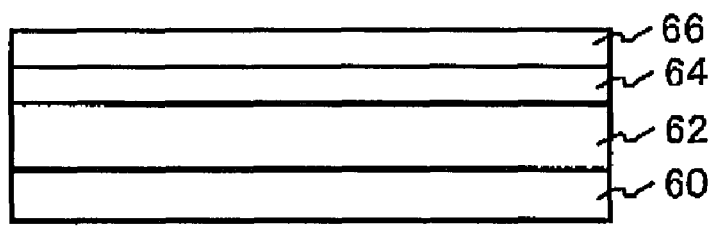
FIG. 13A though FIG. 13D are cross-sectional views showing a fabrication method of the semiconductor device in accordance with the fourth embodiment of the present invention.
Figure 13B:
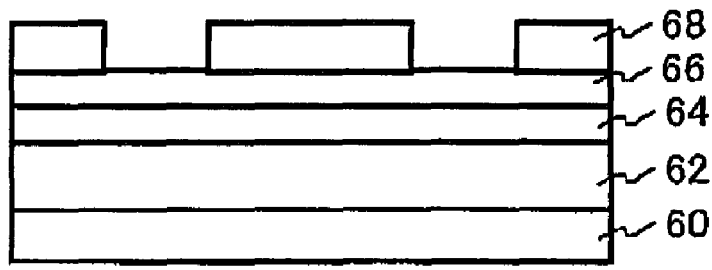
Figure 13C:
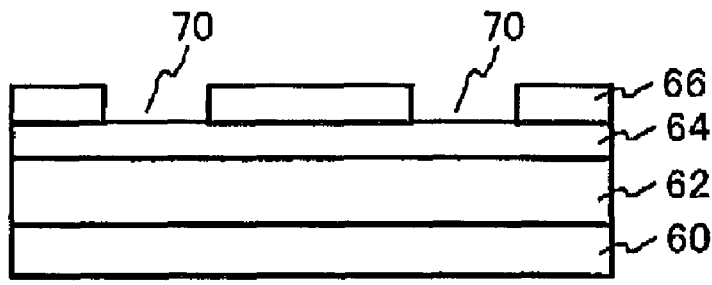
Figure 13D:
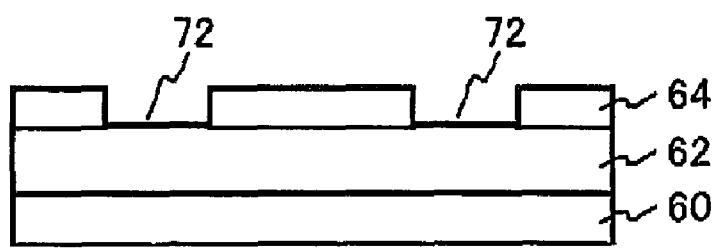

FIG. 13A though FIG. 13D are cross-sectional views showing a fabrication method of the semiconductor device in accordance with the fourth embodiment of the present invention. Referring to FIG. 13A, a first semiconductor layer 62 and a second semiconductor layer 64 are provided on a silicon substrate 60. Here, the second semiconductor layer 64 is a layer to be selectively processed. A silicon nitride film 66 is formed on the second semiconductor layer 64 in the film-forming apparatus and conditions in accordance with the first embodiment.

Referring to FIG. 13B, a photoresist 68 having a given opening pattern is formed on the silicon nitride film 66 with the use of a generally used exposure technique. Referring to FIG. 13C, the silicon nitride film 66 is etched away to form an opening portion 70 having a mask pattern, on the silicon nitride film 66. Then, the photoresist 68 is removed. Referring to FIG. 13D, the second semiconductor layer 64 is selectively etched with the use of the mask pattern of the silicon nitride film 66. In other words, the selective process is carried out. In this manner, a desired opening portion 72 is formed in the second semiconductor layer 64. Then, the silicon nitride film 66 is removed.

Since the silicon nitride film is precisely formed, when formed in the film-forming apparatus and method in accordance with the first embodiment, it is effective to use the silicon nitride film that serves as a mask film in the selective process. It is therefore possible to suppress the deformation of the mask film and peeling off during the selective process such as etching, ion implantation, or selective growth and to provide a fabrication method of a highly accurate semiconductor device.

The present invention is not limited to the above-mentioned embodiments, and other embodiments, variations and modifications may be made without departing from the scope of the present invention.

The present invention is based on Japanese Patent Application No. 2005-093275 filed on Mar. 28, 2005, the entire disclosure of which is hereby incorporated by reference.

What is claimed is:

1. A fabrication method of a capacitive element device comprising:
   forming a first metal layer; and
   forming an insulating film made of a silicon nitride film on the first metal layer with a mixed gas that includes mono-silane gas, hydrogen gas, and nitrogen gas, in a plasma CVD apparatus, under a condition that a flow rate of the hydrogen gas is 0.2 percent to 5 percent to an overall flow rate;
   forming a second metal layer on the insulating layer.

2. The fabrication method as claimed in claim 1, wherein the step of forming the insulating film is a step of forming the silicon nitride film under a condition that a growth temperature ranges 200° C. to 350° C.

3. The fabrication method as claimed in claim 1, wherein the step of forming the insulating film is a step of forming the silicon nitride film under a condition that a flow rate of the mono-silane gas is 0.4 percent to 4.5 percent to an overall flow rate.

4. The fabrication method as claimed in claim 1, wherein the plasma CVD apparatus is any of a parallel plate type high frequency plasma apparatus, an electron cyclotron resonance plasma apparatus, and an inductive coupled type high-density plasma apparatus.

5. The fabrication method as claimed in claim 1, wherein a hydrogen content is at most 1 atomic percent in the silicon nitride film.

6. The fabrication method as claimed in claim 1, wherein the silicon nitride film has a thickness of 50 nm to 300 nm.

* * * * *